(12) United States Patent
Zhou

(10) Patent No.: US 12,053,970 B2
(45) Date of Patent: Aug. 6, 2024

(54) DISPLAY SCREEN AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Mingjun Zhou, Shenzhen (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 670 days.

(21) Appl. No.: 17/051,777

(22) PCT Filed: Jul. 1, 2020

(86) PCT No.: PCT/CN2020/099646
§ 371 (c)(1),
(2) Date: Oct. 30, 2020

(87) PCT Pub. No.: WO2021/203562
PCT Pub. Date: Oct. 14, 2021

(65) Prior Publication Data
US 2023/0137793 A1    May 4, 2023

(30) Foreign Application Priority Data

Apr. 10, 2020    (CN) .......................... 202010279033.X

(51) Int. Cl.
*B32B 7/12*    (2006.01)
*B32B 3/26*    (2006.01)
(Continued)

(52) U.S. Cl.
CPC ................ *B32B 7/12* (2013.01); *B32B 3/266* (2013.01); *C09J 9/00* (2013.01); *H05K 5/03* (2013.01);
(Continued)

(58) Field of Classification Search
CPC ......... G02B 6/00; B32B 2457/20; B32B 7/12; B32B 5/16
See application file for complete search history.

(56) References Cited

U.S. PATENT DOCUMENTS

2002/0196393 A1    12/2002    Tashiro et al.
2013/0033901 A1*    2/2013    Nishitani .......... G02F 1/133615
                                                             362/613
(Continued)

FOREIGN PATENT DOCUMENTS

CN    1536404 A    10/2004
CN    102662277 A    9/2012
(Continued)

*Primary Examiner* — Alicia J Weydemeyer
(74) *Attorney, Agent, or Firm* — PV IP PC; Wei Te Chung; Zhigang Ma

(57) ABSTRACT

The present disclosure provides a display screen and a display device. The display screen includes a display panel, a cover plate, and a shielding layer disposed between the two. The display screen further includes a bonding layer disposed between the shielding layer and the display panel. The bonding layer includes a glue layer including a first side close to the display panel and a second side away from the display panel; and a light guiding portion including a light incident side configured to input ultraviolet light and a light-emitting side configured to output the ultraviolet light to the first side or the second side.

12 Claims, 3 Drawing Sheets

(51) Int. Cl.
*C09J 9/00* (2006.01)
*G02B 5/10* (2006.01)
*H05K 5/03* (2006.01)
*H10K 50/84* (2023.01)

(52) U.S. Cl.
CPC ...... *H10K 50/841* (2023.02); *B32B 2307/418* (2013.01); *B32B 2457/20* (2013.01); *G02B 5/10* (2013.01)

(56) References Cited

U.S. PATENT DOCUMENTS

2017/0059932 A1* 3/2017 Hong .................... G02B 6/0068
2019/0072793 A1* 3/2019 Hu ...................... G02F 1/133553

FOREIGN PATENT DOCUMENTS

| | | | |
|---|---|---|---|
| CN | 202837749 U | | 3/2013 |
| CN | 104035255 A | | 9/2014 |
| CN | 104090687 A | | 10/2014 |
| CN | 104865739 A | | 8/2015 |
| CN | 206440927 U | | 8/2017 |
| CN | 206584138 U | * | 10/2017 |
| CN | 206584138 U | | 10/2017 |
| CN | 108845449 A | | 11/2018 |
| JP | 2004101660 A | | 4/2004 |

* cited by examiner

DISPLAY SCREEN AND DISPLAY DEVICE

RELATED APPLICATIONS

This application is a Notional Phase of PCT Patent Application No. PCT/CN2020/099646 having international filing date of Jul. 1, 2020, which claims the benefit of priority of Chinese Patent Application No. 202010279033.X filed on Apr. 10, 2020. The contents of the above applications are all incorporated by reference as if fully set forth herein in their entirety.

BACKGROUND

Field of Invention

The present disclosure relates to a field of display technology, and more particularly, to a display screen and a display device.

Description of the Prior Art

In an existing display screen 1, as shown in FIG. 1, a black shielding layer 12 is disposed under a cover plate 11 to shield internal circuits of the existing display screen 1. Further, a glue layer 14 is also disposed between the cover plate 11 and a display panel 13 to bond the cover plate 11 and the display panel 13, preventing external water and oxygen from corroding internal components of the display screen 1.

Wherein, a constituent material of the glue layer 14 is ultraviolet (UV) glue. The UV glue is cured under irradiation of light emitted by a UV lamp 15. As shown in FIG. 1, if the UV lamp 15 is disposed on a side adjacent to the cover plate 11, the black shielding layer 12 will block the light emitted by the UV lamp 15. If the UV lamp 15 is disposed on a side adjacent to the display panel 13, the display panel 13 also blocks the light emitted by the UV lamp 15, which causes a curing performance to decrease.

Therefore, it is necessary to provide a display screen that can improve the curing performance.

SUMMARY

A purpose of the present disclosure is to provide a display screen and a display device, improving a curing performance of the display screen.

The present disclosure provides a display screen, including: a display panel, a cover plate, and a shielding layer disposed between the display panel and the cover plate, wherein the display screen further includes:
 a bonding layer disposed between the shielding layer and the display panel, including:
  a glue layer including:
   a first side, wherein the first side is a side of the glue layer adjacent to the display panel; and
   a second side, wherein the second side is a side of the glue layer away from the display panel; and
  a light guiding portion including:
   a light incident side configured to input ultraviolet light; and
   a light-emitting side configured to output the ultraviolet light to the first side of the glue layer, or to output the ultraviolet light to the second side of the glue layer;
 wherein the light guiding portion is disposed between the display panel and the glue layer, and the light-emitting side of the light guiding portion is in contact with the first side of the glue layer; or
 wherein the glue layer is disposed between the light guiding portion and the display panel, and the light-emitting side of the light guiding portion is in contact with the second side of the glue layer.

In an embodiment, the light guiding portion further includes a plurality of refraction portions, and the plurality of refraction portions are disposed on the light-emitting side of the light guiding portion.

The present disclosure further provides a display screen, including: a display panel, a cover plate, and a shielding layer disposed between the display panel and the cover plate, wherein the display screen further includes:
 a bonding layer disposed between the shielding layer and the display panel, including:
  a glue layer including:
   a first side, wherein the first side is a side of the glue layer adjacent to the display panel; and
   a second side, wherein the second side is a side of the glue layer away from the display panel; and
  a light guiding portion including:
   a light incident side configured to input ultraviolet light; and
   a light-emitting side configured to output the ultraviolet light to the first side of the glue layer, or to output the ultraviolet light to the second side of the glue layer.

In an embodiment, the light guiding portion is disposed between the display panel and the glue layer, and the light-emitting side of the light guiding portion is in contact with the first side of the glue layer.

In an embodiment, the glue layer is disposed between the light guiding portion and the display panel, and the light-emitting side of the light guiding portion is in contact with the second side of the glue layer.

In an embodiment, the light guiding portion further includes a plurality of refraction portions, and the plurality of refraction portions are disposed on the light-emitting side of the light guiding portion.

In an embodiment, the light-emitting side of the light guiding portion includes a first area defined by an area disposed opposite to the glue layer, and the plurality of refraction portions are disposed on the first area.

In an embodiment, the light guiding portion further includes a plurality of light-emitting holes defined between adjacent refraction portions of the plurality of refraction portions.

In an embodiment, light-emitting side of the light guiding portion further includes a second area defined by an area of the light-emitting side excluding the first area, and the light guiding portion further includes a reflector disposed on the second area.

In an embodiment, the light guiding portion further includes a reflection sheet disposed on a side of the light guiding portion opposite to the light incident side, and on a side of the light guiding portion opposite to the light-emitting side.

In an embodiment, the light guiding portion further includes a plurality of reflection portions disposed on a side of the light guiding portion opposite to the light-emitting side.

The present disclosure further provides a display device, including: a display screen including a display panel, a cover plate, and a shielding layer disposed between the display panel and the cover plate, wherein the display screen further includes:

a bonding layer disposed between the shielding layer and the display panel, including:
   a glue layer including:
      a first side, wherein the first side is a side of the glue layer adjacent to the display panel; and
      a second side, wherein the second side is a side of the glue layer away from the display panel; and
   a light guiding portion including:
      a light incident side configured to input ultraviolet light; and
      a light-emitting side configured to output the ultraviolet light to the first side of the glue layer, or to output the ultraviolet light to the second side of the glue layer.

In an embodiment, the light guiding portion is disposed between the display panel and the glue layer, and the light-emitting side of the light guiding portion is in contact with the first side of the glue layer.

In an embodiment, the glue layer is disposed between the light guiding portion and the display panel, and the light-emitting side of the light guiding portion is in contact with the second side of the glue layer.

In an embodiment, the light guiding portion further includes a plurality of refraction portions, and the plurality of refraction portions are disposed on the light-emitting side of the light guiding portion.

In an embodiment, the light-emitting side of the light guiding portion includes a first area defined by an area disposed opposite to the glue layer, and the plurality of refraction portions are disposed on the first area.

In an embodiment, the light guiding portion further includes a plurality of light-emitting holes defined between adjacent refraction portions of the plurality of refraction portions.

In an embodiment, the light-emitting side of the light guiding portion further includes a second area defined by an area of the light-emitting side excluding the first area, and the light guiding portion further includes a reflector disposed on the second area.

In an embodiment, the light guiding portion further includes a reflection sheet disposed on a side of the light guiding portion opposite to the light incident side, and on a side of the light guiding portion opposite to the light-emitting side.

In an embodiment, the light guiding portion further includes a plurality of reflection portions disposed on the side of the light guiding portion opposite to the light-emitting side.

The display screen and the display device according to an embodiment of the present disclosure provide the light guiding portion to transmit the ultraviolet light to the glue layer, so that the glue layer can be cured under sufficient ultraviolet light irradiation, improving the curing performance of the display screen.

BRIEF DESCRIPTION OF DRAWINGS

Technical solutions and other beneficial effects of the present disclosure will be obvious by describing the specific implementation of the present disclosure in detail with reference to the accompanying drawings.

DETAILED DESCRIPTION OF PREFERRED EMBODIMENTS

Figure 1:
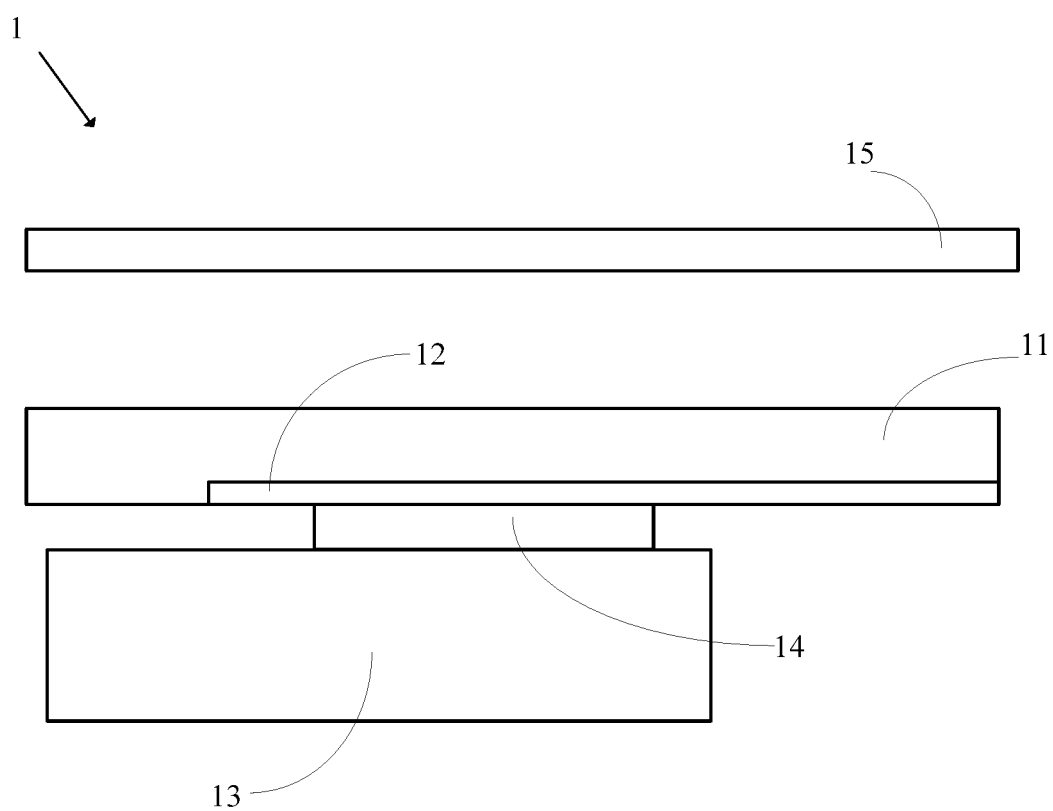
FIG. 1 is a structural schematic diagram of an existing display screen.

Embodiments of the present disclosure are described in detail with the technical matters, structural features, achieved objects, and effects with reference to the accompanying drawings as follows. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

In the description of the present disclosure, it should be noted that unless otherwise clearly defined and limited, the terms "mounted", "connected/coupled", and "connection" should be interpreted broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly; they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

Figure 2:
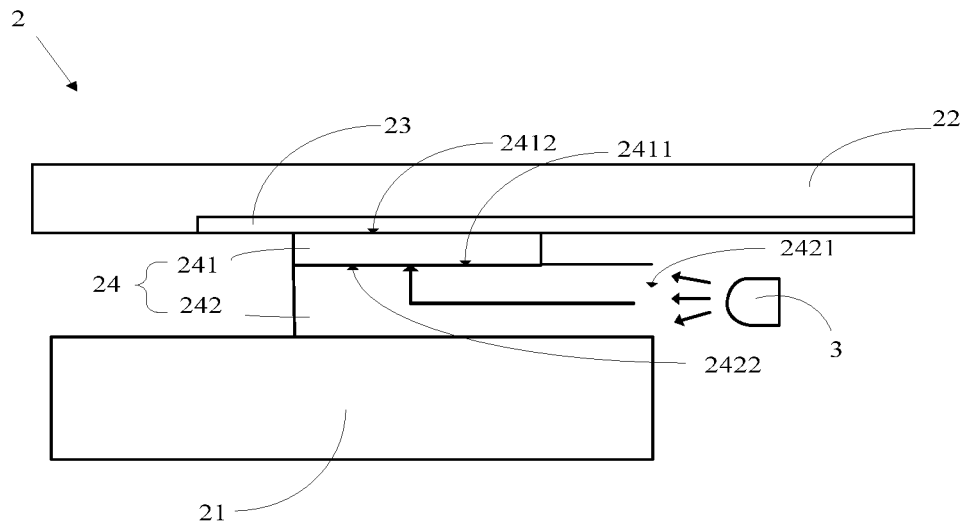
FIG. 2 is a first structural schematic diagram of a display screen according to an embodiment of the present disclosure.

The present disclosure provides a display device. The display device includes a display screen. Please refer to FIG. 2, FIG. 2 is a structural schematic diagram of the display screen according to an embodiment of the present disclosure. As shown in FIG. 2, a display screen 2 includes a display panel 21 and a cover plate 22. Wherein, the display panel 21 can be a liquid crystal display panel or an organic light-emitting panel, which is not specifically limited herein. The cover plate 22 can be made of high-hardness materials such as glass, sapphire, or ceramics, and has a good wear-resisting property to protect internal components in the display panel 21.

In order to prevent components in the display panel 21 from being exposed on an appearance surface, a shielding layer 23 is disposed on a side of the cover plate 21 adjacent to the display panel 21. Wherein, the shielding layer 23 can be made of a material with a low light transmittance, such as a material with a light transmittance less than 10%. Specifically, a constituent material of the shielding layer 23 can include black ink.

Furthermore, the display screen 2 further includes a bonding layer 24. Wherein, the bonding layer 24 is disposed between the shielding layer 23 and the display panel 21, and can fix the display panel 21 and the cover plate 22 together.

As shown in FIG. 2, the bonding layer 24 includes a glue layer 241. Wherein a constituent material of the glue layer 241 includes UV glue. The glue layer 241 includes a first side 2411 and a second side 2412. The first side 2411 is a side of the glue layer 241 adjacent to the display panel 21. The second side 2412 is a side of the glue layer 241 away from the display panel 21. As shown in FIG. 2, if the ultraviolet light enters from a side adjacent to the cover plate 22, both the first side 2411 and the second side 2412 of the glue layer 241 are shielded by the shielding layer 23. If the ultraviolet light enters from a side adjacent to the display panel 21, the first side 2411 and the second side 2412 of the glue layer 241 are also shielded by opaque components such as thin-film transistors disposed in the display panel 21. In this way, the glue layer 241 cannot receive enough ultraviolet light irradiation, causing a decrease of a curing performance of the glue layer 241.

In an embodiment of the disclosure, the bonding layer 24 further includes a light guiding portion 242. The light guiding portion 242 includes a light incident side 2421 and a light-emitting side 2422. The light incident side 2421 is configured to input the ultraviolet light. The light-emitting side 2422 is configured to output the ultraviolet light to the first side 2411 or the second side 2412 of the glue layer 241, making the glue layer 241 be cured under enough ultraviolet light irradiation.

In an embodiment, as shown in FIG. 2, the light guiding portion 242 is disposed between the display panel 21 and the glue layer 241, and the light-emitting side 2422 of the light guiding portion 242 is in contact with the first side 2411 of the glue layer 241. In this way, the light-emitting side 2422 of the light guiding portion 242 is configured to output the ultraviolet light to the first side 2411 of the glue layer 241.

Figure 3:
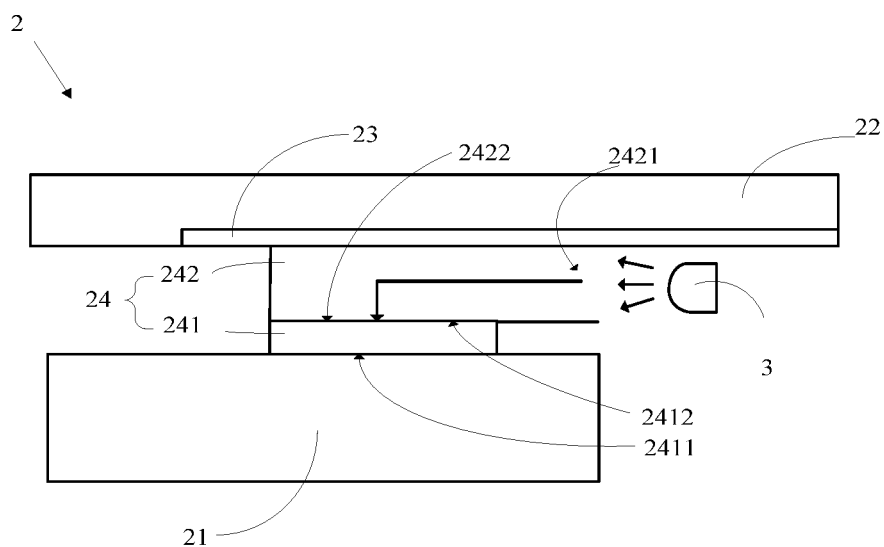
FIG. 3 is a second structural schematic diagram of the display screen according to an embodiment of the present disclosure.

In an embodiment, as shown in FIG. 3, the glue layer 241 is disposed between the light guiding portion 242 and the display panel 21. The light-emitting side 2422 of the light guiding portion 242 is in contact with the second side 2412 of the glue layer 241. In this way, the light-emitting side 2422 of the light guiding portion 242 is configured to output the ultraviolet light to the second side 2412 of the glue layer 241.

Figure 4:
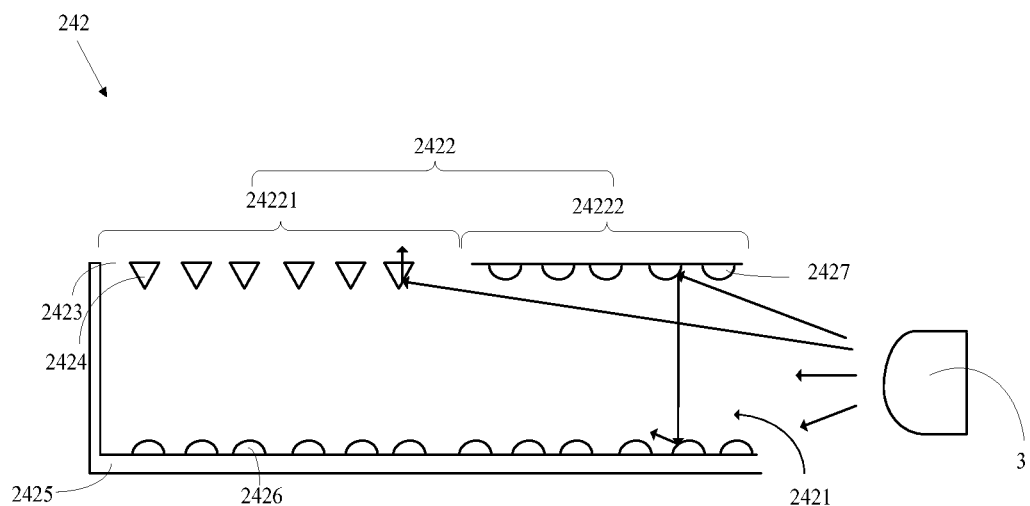
FIG. 4 is a structural schematic diagram of a light guiding portion according to an embodiment of the present disclosure.

In an embodiment, as shown in FIG. 4, the light guiding portion 242 further includes a plurality of refraction portions 2424. The plurality of refraction portions 2424 are disposed on the light-emitting side 2422 of the light guiding portion 242. As shown in FIG. 4, a light emitted from a UV lamp 3 toward to the light-emitting side 2422 of the light guiding portion 242 is outputted by a refraction of the refraction portions 2424. Wherein, a shape of the plurality of refraction portions 2424 may be a taper.

The light guiding portion 242 further includes a plurality of light-emitting holes 2423. The plurality of light-emitting holes 2423 are defined on the light-emitting side 2422 of the light guiding portion 242. Specifically, the light-emitting holes 2423 are defined between two adjacent refraction portions 2424. The light-emitting holes 2423 can be configured to guide the ultraviolet light to emit to the first side 2422 or the second side 2412 of the glue layer 241.

In an embodiment, the light-emitting side 2422 of the light guiding portion 242 includes a first area 24221 and a second area 24222. Wherein, the first area 24221 is defined by an area disposed opposite to the glue layer 241, and the second area 24222 is defined by an area of the light-emitting side 2422 excluding the first area 24221.

The light-emitting holes 2423 and the refraction portions 2424 can be only defined on the first area 24221, so as to prevent the ultraviolet light from escaping from the second area 24222. In an embodiment, a reflector 2427 can also be disposed on the second area 24222, and can reflect the ultraviolet light irradiated on the second area 24222 back into an inside of the light guiding portion 242 to improve a utilization rate. Wherein, the reflector 2427 can have a hemispherical shape.

Since the ultraviolet light in the light guiding portion 242 is reflected multiple times, the ultraviolet light can escape from a side of the light guiding portion 242 opposite to the light incident side 2421, or from a side of the light guiding portion 242 opposite to the light-emitting side 2422. Therefore, in an embodiment, a reflection sheet 2425 is also disposed in the light guiding portion 242. Specifically, the reflection sheet 2425 is also disposed on the side of the light guiding portion 242 opposite to the light incident side 2421, and on the side of the light guiding portion 242 opposite to the light-emitting side 2422. That is, the reflection sheet 2425 can be disposed as an L-shaped shape. In this way, the reflection sheet 2425 can refract the ultraviolet light back to the light guiding portion 242 for multiple refraction, until the ultraviolet light is exported by the light-emitting holes 2423.

In an embodiment, the light guiding portion 242 further includes a plurality of reflection portions 2426. The plurality of reflection portions 2426 are disposed on the side of the light guiding portion 242 opposite to the light-emitting side 2422, and can reflect the ultraviolet light irradiated on the side back into an inside of the light guiding portion 242 to improve a utilization rate. Wherein, the reflection portions 2426 can have a hemispherical shape.

The display screen and the display device according to an embodiment of the present disclosure provide the light guiding portion to transmit the ultraviolet light to the glue layer, so that the glue layer can be cured under sufficient ultraviolet light irradiation, improving the curing performance of the display screen.

In the foregoing embodiments, the description of each embodiment has its own emphasis. For the parts that are not described in detail in one embodiment, reference may be made to related descriptions in other embodiments.

The display screen and the display device provided by the embodiments of the present disclosure are described in detail. The principles and implementations of the present disclosure are described in combination with specific embodiments. The above description of the embodiments is merely for the purpose of understanding the disclosure. In the meantime, for those skilled in the art, there will be changes in the specific implementation and application scope according to the idea of the present disclosure. In conclusion, the content of the specification of the present disclosure should not be construed as limitations of the scope of the present disclosure.

What is claimed is:

1. A display screen, comprising: a display panel, a cover plate, and a shielding layer disposed between the display panel and the cover plate, wherein the display screen further comprises:
    a bonding layer disposed between the shielding layer and the display panel, comprising:
      a glue layer comprising:
        a first side, wherein the first side is a side of the glue layer adjacent to the display panel; and
        a second side, wherein the second side is a side of the glue layer away from the display panel; and
      a light guiding portion comprising:
        a light incident side configured to input ultraviolet light, wherein the light incident side is on a side surface of the light guiding portion;
        a light-emitting side configured to output the ultraviolet light to the first side of the glue layer, or to output the ultraviolet light to the second side of the glue layer, wherein the light-emitting side is on a surface of the light guiding portion connected to the glue layer, the light incident side is perpendicular to the light-emitting side, and the light-emitting side comprises a plurality of refraction portions and a reflector and
      a reflection sheet comprising a first portion opposite to the light incident side and a second portion opposite to the light-emitting side, wherein the reflection sheet has an L-shaped shape, a plurality of reflection portions are disposed on the second portion, and the reflection portions have a hemispherical shape.

2. The display screen as claimed in claim 1, wherein the light guiding portion is disposed between the display panel and the glue layer, and the light-emitting side of the light guiding portion is in contact with the first side of the glue layer.

3. The display screen as claimed in claim 1, wherein the glue layer is disposed between the light guiding portion and the display panel, and the light-emitting side of the light guiding portion is in contact with the second side of the glue layer.

4. The display screen as claimed in claim 1, wherein the light-emitting side of the light guiding portion comprises a first area defined by an area disposed opposite to the glue layer, and the plurality of refraction portions are disposed on the first area.

5. The display screen as claimed in claim 1, wherein the light guiding portion further comprises a plurality of light-emitting holes defined between adjacent refraction portions of the plurality of refraction portions.

6. The display screen as claimed in claim 1, wherein the light-emitting side of the light guiding portion further comprises a second area defined by an area of the light-emitting side excluding the first area, and the reflector is disposed on the second area.

7. A display device, comprising: a display screen comprising a display panel, a cover plate, and a shielding layer disposed between the display panel and the cover plate, wherein the display screen further comprises:
    a bonding layer disposed between the shielding layer and the display panel, comprising:
      a glue layer comprising:
        a first side, wherein the first side is a side of the glue layer adjacent to the display panel; and
        a second side, wherein the second side is a side of the glue layer away from the display panel; and
      a light guiding portion comprising:
        a light incident side configured to input ultraviolet light, wherein the light incident side is on a side surface of the light guiding portion;
        a light-emitting side configured to output the ultraviolet light to the first side of the glue layer, or to output the ultraviolet light to the second side of the glue layer, wherein the light-emitting side is on a surface of the light guiding portion connected to the glue layer, the light incident side is perpendicular to the light-emitting side, wherein the light-emitting side comprises a plurality of refraction portions;
      a reflection sheet comprising a first portion opposite to the light incident side and a second portion opposite to the light-emitting side, wherein the reflection sheet has an L-shaped shape, a plurality of reflection portions are disposed on the second portion, and the reflection portions have a hemispherical shape.

8. The display device as claimed in claim 7, wherein the light guiding portion is disposed between the display panel and the glue layer, and the light-emitting side of the light guiding portion is in contact with the first side of the glue layer.

9. The display device as claimed in claim 7, wherein the glue layer is disposed between the light guiding portion and the display panel, and the light-emitting side of the light guiding portion is in contact with the second side of the glue layer.

10. The display device as claimed in claim 7, wherein the light-emitting side of the light guiding portion comprises a first area defined by an area disposed opposite to the glue layer, and the plurality of refraction portions are disposed on the first area.

11. The display device as claimed in claim 7, wherein the light guiding portion further comprises a plurality of light-emitting holes defined between adjacent refraction portions of the plurality of refraction portions.

12. The display device as claimed in claim 7, wherein the light-emitting side of the light guiding portion further comprises a second area defined by an area of the light-emitting side excluding the first area, and the reflector is disposed on the second area.

\* \* \* \* \*